MOS TRANSISTOR WITH ALUMINUM OXIDE GATE DIELECTRIC
Filed Oct. 28, 1970
FIG. 1.
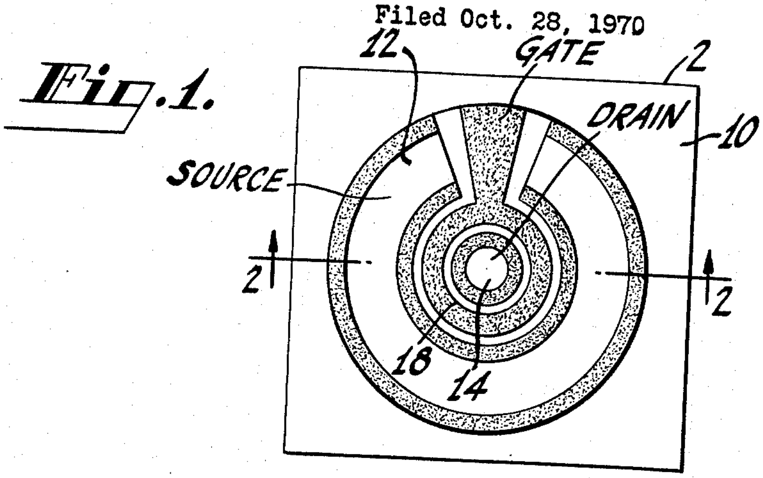
FIG. 2.
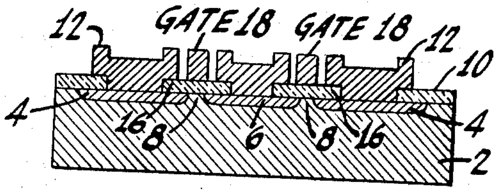
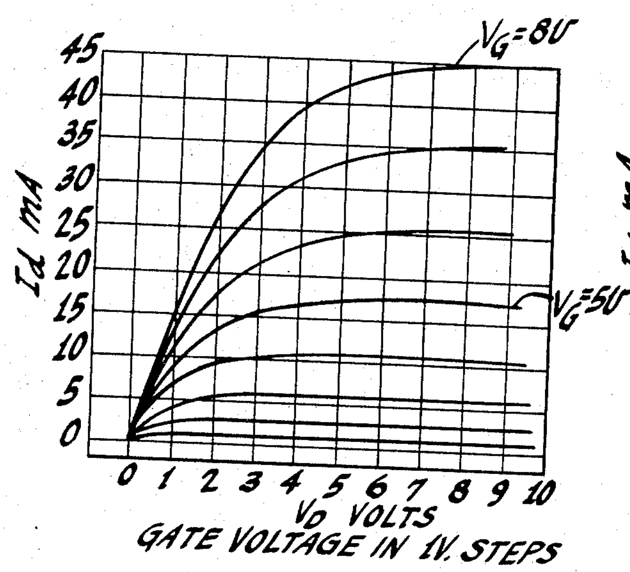
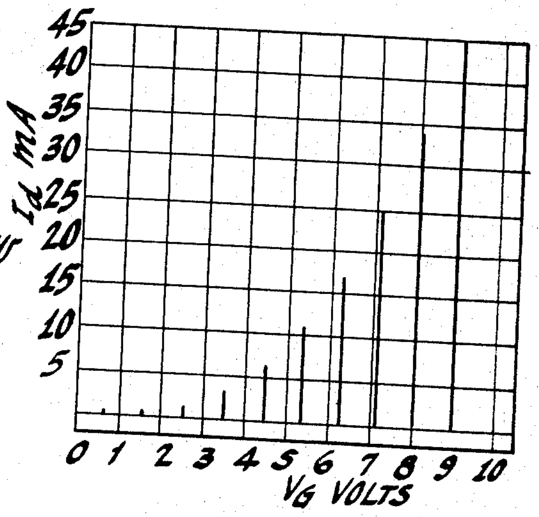
FIG. 3. FIG. 4.
Inventor:
MICHAEL T. DUFFY
BY W. S. Hill
Agent 3,702,786

MOS TRANSISTOR WITH ALUMINUM OXIDE GATE DIELECTRIC

Michael Thomas Duffy, Princeton Junction, N.J., assignor to RCA Corporaion

Filed Oct. 28, 1970, Ser. No. 84,628
Int. Cl. B44d *1/18*; C23c *11/00*
U.S. Cl. 117—212 9 Claims

ABSTRACT OF THE DISCLOSURE

A method of making an MOS transistor having a film of $Al_2O_3$ as its gate electrode insulator, comprising depositing the oxide by a vapor deposition process, then heating the deposited film at a temperature of above about 700° C. in a wet gas atmosphere.

BACKGROUND OF THE INVENTION

The invention herein disclosed was made in the course of or under a contract or subcontract thereunder with the Department of the Navy.

Unipolar transistors of the type now commonly known as "MOS" (metal-oxide-semiconductor) transistors have diffused source and drain regions spaced apart adjacent a surface of a semiconductor chip. They also have a gate electrode comprising a layer of an insulating oxide on the surface of the semiconductor body between the source and drain regions and a metal electrode layer disposed on the oxide layer. The metal electrode layer, the oxide layer and the semiconductor body function as a capacitor. In a so-called "enhancement" type transistor, voltage applied across this capacitor attracts charges of sign opposite to that on the metal electrode, to the oxide-semiconductor interface and, because of the pre-arranged conductivity type of the body, increases the conductivity of a thin layer adjacent the surface of the body. The increased conductivity also increases the current-carrying ability of the thin surface layer. Thus, current between source and drain may be modulated by varying voltage applied to the gate electrode. Another type of unipolar transistor, known as a "depletion" type, utilizes repulsion of charges out of the surface layer by a like charge on the gate electrode, to modulate current.

Most MOS devices previously have used silicon dioxide as the gate electrode insulator. Although silicon dioxide has proved to be satisfactory in many device applications, it has certain disadvantages which have caused semiconductor research engineers to look for a more satisfactory material. One of the insulator materials found promising is $Al_2O_3$. Some of the advantages that $Al_2O_3$ films have over $SiO_2$ films are greater radiation resistance, greater impermeability to impurity diffusion, and higher dielectric constant.

It has also been found, however, that $Al_2O_3$ gate insulator layers, as previously prepared, have some disadvantages such as undesirably high threshold voltages (voltage across the gate electrode at which current begins to flow from source-to-drain). This threshold voltage may be six volts or more. Another disadvantage of $Al_2O_3$ films, as previously deposited, is undesirably high DC conduction. Untreated $Al_2O_3$ films have also exhibited unwanted hysteresis effects.

In an effort to improve the $Al_2O_3$ gate dielectric layers, they have been previously subjected to dry oxygen treatments. This reduced the hysteresis effects but has not cured the other defects mentioned.

OBJECTS OF THE INVENTION

An object of the present invention is to provide an improved method of treating an $Al_2O_3$ gate insulator layer of an MOS transistor so that some of the disadvantages of the oxide are removed.

A further object of the invention is to provide an improved MOS transistor.

THE DRAWING

FIG. 1 is a top plan view of an MOS transistor in accordance with the present invention;

FIG. 2 is a section view taken along the line II—II of FIG. 1;

FIG. 3 is a family of characteristics of drain current v. drain voltage at various gate voltages for the transistor of FIGS. 1 and 2, and FIG. 4 is a family of characteristics of drain current v. gate voltage for the transistor of FIGS. 1, 2 and 3.

DESCRIPTION OF PREFERRED EMBODIMENT

The method of the present invention can be used to make improved MOS transistors of any conventional geometric configuration which includes an insulated gate to control current between source and drain. One such transistor, as shown in FIGS. 1 and 2, comprises a P type silicon body 2, a diffused N+ type source region 4 having an annular shape, and a diffused N+ type drain region 6, having a "dot" shape, disposed within the circular source region. The transistor also includes a channel region 8, of annular shape, disposed between source 4 and drain 6.

The transistor further includes a protective insulating layer 10 having openings therein for making connection to the source and drain region. In one of these openings is aluminum electrode 12, of generally annular shape but having a segment missing. Another opening contains an aluminum contact electrode 14 to the drain region.

A portion 16 of the insulating layer 10 over the channel region 8 is the dielectric part of the gate electrode for controlling current flow between source region 4 and drain region 6. Over the gate dielectric layer 8 is a gate electrode 18 of aluminum.

As examples of dimensions that may be used, in an experimental transistor, the outer diameter of source region 4 was 900$\mu$. The diameter of the drain region 6 was 400$\mu$. The width of the channel region 8 was 10$\mu$. The diffusion depth of the source and drain regions was about 1$\mu$. The thickness of the aluminum metallization was 5000 A. And the thickness of the insulating layer 10 was 1000 A.

An example of manufacture of a transistor, including the method of the invention, is as follows.

Beginning with the P type silicon body 2 having diffused N+ type source and drain regions 4 and 6, a layer of amorphous $Al_2O_3$ is deposited over the entire upper surface of the body 2 by a chemical vapor deposition process. A heated inert gas, such as helium or nitrogen, is bubbled through liquid aluminum isopropoxide, $$Al(OC_3H_7)_3$$

maintained at a temperature of 12°–140° C. Helium is preferred since commercial grades of adequate purity are easier to obtain. Description of suitable apparatus for carrying out the aluminum oxide deposition is found in an article published in J. Electrochem. Soc., vol. 116, page 234, 1969. The apparatus is a vertical reactor in which the aluminum isopropoxide is disposed in a container at the upper end of the column. The helium gas carrying the aluminum isopropoxide vapor descends through the column. As it descends it is mixed with a carrier gas such as nitrogen, or a mixture of nitrogen and oxygen, which is supplied at a rate sufficient to sweep the vapor over the susceptor rapidly enough to prevent the formation of objectionable convection currents adjacent the silicon substrate surface.

The silicon substrate is preferably RF heated to a temperature of 450° C. This may vary from about 400°–500° C. and higher. As the aluminum isopropoxide vapors come into contact with the hot substrate they are pyrolyzed and $Al_2O_3$ is deposited. Since commercial aluminum isopropoxide contains carbon as a constituent, oxygen is preferably included in the carrier gas to oxidize the carbon to carbon dioxide. If this is not done there is danger that some carbon will deposit on the silicon substrate. As mentioned previously, the aluminum oxide film thickness is usually controlled to about 1000 A.

After removal of the coated silicon substrate from the deposition chamber, a pattern of photoresist is deposited on the $Al_2O_3$ layer by conventional photomasking and developing procedures. Openings are left in the resist where metal contacts are to be made to the source region 4 and drain region 6.

The $Al_2O_3$ is then removed from the areas not covered by resist by etching in 85% (by wt.) phosphoric acid at 65° C. for about 6 minutes. The assembly is then dipped in dilute hydrofluoric acid for a few seconds to remove last traces of oxide from the contact areas. Photoresist is then removed from the remainder of the $Al_2O_3$ layer.

The assembly is then replaced in the deposition chamber on the susceptor and RF heated to about 800° C. Meanwhile oxygen (or other preferably non-reducing gas) is bubbled through distilled water and water vapor is swept over the heated aluminum oxide layer for about 30 minutes. This treatment modifies the properties of the $Al_2O_3$ layer so that when it is utilized as the dielectric layer of an MOS transistor gate electrode, some of the characteristics of the device are markedly improved as will be explained later.

After the heat treatment in moist gaseous atmosphere as described above, the assembly is again dipped in dilute hydrofluoric acid to remove a very thin film of $SiO_2$ which forms on the exposed silicon contact areas as a result of the heat treatment.

Next, the assembly is placed in a vacuum evaporation chamber and a layer of aluminum is evaporated over the entire surface of the assembly which has the $Al_2O_3$ layer. By conventional photomasking and developing techniques the aluminum is removed everywhere except the source and drain electrode contacts 12 and 14 and gate electrode contact 18 (FIGS. 1 and 2). The remaining photoresist is then removed, leaving the structure shown in FIGS. 1 and 2.

Next, the assembly is heated in an inert gas at about 500° C. to alloy the aluminum to the silicon and make the source and drain contacts more ohmic.

Characteristics of a transistor, made as described above, are illustrated in FIGS. 3 and 4. These figures illustrate one of the improvements in transistors of the present invention compared to prior art transistors having $Al_2O_3$ gate electrode dielectric layers. FIG. 3 is a family of curves of drain current, $I_D$, plotted against drain voltage, $V_D$, for various values of gate voltage increased in 1 volt steps. The data show that transistors having desirable electrical characteristics can be made by the improved method. The drain current rises steeply but in a regular manner as gate voltage is increased.

Several transistors, made as described above, had a transconductance of about 10,000 microsiemens at 25 ma. source-drain current for an applied gate voltage of 6.5 volts. The thickness of the $Al_2O_3$ layer was 1000 A. The transistors had a calculated field effect mobility of about 220 cm.$^2$/volt second.

FIG. 4 is a plot of drain current, $I_D$, against gate voltage, $V_G$, for various values of drain voltage, $V_D$, and illustrates the unusually low threshold voltage of transistors of the present invention. This figure shows that measurable drain current flows even at 1 volt gate voltage. Prior art transistors in which the $Al_2O_3$ was deposited by pyrolyzing aluminum isopropoxide but with no heat treatment in moist gaseous atmosphere, have threshold voltages of about 4 to 6 volts.

Another advantage in transistors made by the method of the present invention is decreased hysteresis effects in the dielectric layer. Although $Al_2O_3$ layers deposited by chemical deposition and heat treated in dry oxygen do not always show hysteresis effects, where these are still present they are reduced or eliminated with the wet gaseous heat treatment of the present invention.

Another advantage that is obtained by using the method of the present invention is that DC conduction of the $Al_2O_3$ dielectric is decreased.

Although oxygen has been utilized as a carrier for the water vapor in the example given of heat treatment of the $Al_2O_3$ gate dielectric layer, other gases that will not react in a harmful manner with $Al_2O_3$ may also be used. Examples of these are any of the inert gases and nitrogen.

In the example described, $Al_2O_3$ was used as the protective passivating coating on the entire device surface. However, on the parts other than the gate dielectric, other insulating materials conventional in this art, such as silicon dioxide and silicon nitride, can also be used. And the insulating layer may be thicker where bonding pads are to be deposited to prevent shorting to the substrate when wire connections are attached.

The temperature of heat treatment in the moist gaseous atmosphere can be between about 700° C. and about 1200° C. The time of treatment can also be varied from about 5 to 60 minutes. By varying the treating temperature or the time (or both) the effect on the threshold voltable of the transistor can also be varied. Thus almost any threshold voltage between about 1 volt and about 6 volts can be obtained.

The aluminum oxide layer can be formed by any suitable chemical vapor deposition process. Aluminum compounds other than aluminum isopropoxide can be pyrolyzed to deposit the aluminum oxide layer. Another example is $AlCl_3$ which is sublimed at a temperature of of about 130° C., the vapor carried in a stream of hydrogen into the reaction chamber and mixed with carbon dioxide. At a temperature of about 850° C. or above the hydrogen and carbon dioxide react to form water and carbon monoxide and the water reacts with the $AlCl_3$ to form $Al_2O_3$ and HCl gas.

Other organo-aluminum compounds are also suitable. Another example of such compound which has been used is tri-methyl aluminum. Where oxygen is not already present in the compound it must be reacted with a source of oxygen in order to form the $Al_2O_3$.

Although chemical vapor process reactions are preferred for forming the $Al_2O_3$ layer, the oxide may also be deposited by physical vapor deposition methods such as sputtering aluminum oxide or sputtering aluminum into an oxygen-containing atmosphere or by impinging an electron beam on a body of $Al_2O_3$ to vaporize the oxide and then cause it to deposit on a silicon substrate. If the substrate is heated, adherence of the oxide is improved.

The exact manner in which the gate electrode dielectric layer is modified by the heated water vapor treatment is not entirely understood. It is believed, however, that the water vapor or its constituents diffuse through the aluminum oxide layer and modify the silicon-aluminum oxide interface in some way.

I claim:

1. In a method of making an MOS transistor of the type including a silicon body and a metal gate electrode with the gate insulator comprising a layer of aluminum oxide, the improvement comprising:

forming said layer by depositing aluminum oxide from the vapor phase, and heating the deposited layer at a temperature of about 700° C. to 1200° C. in a wet gaseous atmosphere for a time sufficient to reduce the threshold voltage to a desired value.

2. A method according to claim 1 in which said aluminum oxide is deposited by pyrolysis of an organo-aluminum compound.

3. A method according to claim 2 in which said organo-alumium compound is aluminum isopropoxide.

4. A method according to claim 3 in which said aluminum isopropoxide is vaporized by bubbling an inert gas therethrough while maintaining the temperature thereof at about 120°–140° C. and then pyrolyzing the vapor by directing it against a surface of said silicon body maintained at a temperature of about 400°–500° C.

5. A method according to claim 1 in which said wet oxidizing atmosphere comprises oxygen and water vapor.

6. A method according to claim 1 in which said wet oxidizing atmosphere comprises an inert gas and water vapor.

7. A method according to claim 1 in which said heating is continued for from 5 to 60 minutes.

8. A method according to claim 1 in which said aluminum oxide layer is heated in moist gas at a temperature of about 800° C.

9. An MOS transistor of the type including a silicon body, source and drain regions within said body and a metal gate electrode disposed on a gate insulator layer, the improvement wherein said gate insulator is composed of aluminum oxide formed by depositing said aluminum oxide from the vapor phase and heating the deposited layer at a temperature of about 700° C. to 1200° C. in a wet gaseous atmosphere for about 5 to 60 minutes.

References Cited

UNITED STATES PATENTS

| | | | |
|---|---|---|---|
| 3,580,745 | 5/1971 | Kooi et al. | 317—235 X |
| 3,556,966 | 1/1971 | Waxman et al. | 317—235 X |

OTHER REFERENCES

Powell et al.: Vapor Deposition, John Wiley & Sons, N.Y., 1967, pp. 386–389.

Kooi: The Surface Properties of Oxidized Silicon; Springer-Verlag, N.Y., 1967, p. 14, pp. 34–35.

RALPH S. KENDALL, Primary Examiner
D. A. SIMMONS, Assistant Examiner

U.S. Cl. X.R.

117—62, 106 R; 317—235